(12) United States Patent
Lai et al.

(10) Patent No.: US 6,764,573 B2
(45) Date of Patent: Jul. 20, 2004

(54) WAFER THINNING TECHNIQUES

(75) Inventors: Richard Lai, Redondo Beach, CA (US); Harvey N. Rogers, Playa del Rey, CA (US); Yaochung Chen, Rancho Palos Verdes, CA (US); Michael E. Barsky, Sherman Oaks, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 0 days.

(21) Appl. No.: 09/977,158

(22) Filed: Oct. 11, 2001

(65) Prior Publication Data

US 2003/0071009 A1 Apr. 17, 2003

(51) Int. Cl.7 .................................................. B08B 3/02
(52) U.S. Cl. ............................ 156/345.11; 156/345.21; 156/345.23; 156/345.15
(58) Field of Search ....................... 156/345.11, 345.21, 156/345.23, 345.15

(56) References Cited

U.S. PATENT DOCUMENTS

| | | | | |
|---|---|---|---|---|
| 4,350,553 A | * | 9/1982 | Mendes | 156/345.15 |
| 5,976,312 A | * | 11/1999 | Shimizu et al. | 156/345.55 |
| 6,187,515 B1 | * | 2/2001 | Tran et al. | 430/321 |
| 6,203,659 B1 | * | 3/2001 | Shen et al. | 156/345.15 |
| 6,235,147 B1 | * | 5/2001 | Lee et al. | 156/345.21 |

* cited by examiner

*Primary Examiner*—Gregory Mills
*Assistant Examiner*—Sylvia R. MacArthur
(74) *Attorney, Agent, or Firm*—Harness, Dickey & Pierce, P.L.C.

(57) ABSTRACT

Apparatuses (10, 100), and methods of using same, for the simultaneous thinning of the backside surfaces of a plurality of semiconductor wafers (W) using a non-crystallographic and uniform etching process, are described. The apparatuses (10, 100) include a fixture (12, 102) having a plurality of horizontal receptacles (14, 16, 18, 20, 104, 106, 108, 110) for receiving the semiconductor wafers (W). The loaded fixtures (12, 102) are then immersed into an etchant solution (36, 146) that is capable of isotropically removing a layer of semiconductor material from the backside surface of the semiconductor wafers (W). The etchant solution (36, 146) is preferably heated to about 40° C.–50° C. and constantly stirred with a magnetic stirring bar (48, 158). Once a sufficient period of time has elapsed, the thinned semiconductor wafers (W) are removed from the etchant solution (36, 146). The apparatuses (10, 100) are capable of simultaneously thinning several semiconductor wafers (V) down to a final thickness of about 25 μm.

16 Claims, 5 Drawing Sheets

WAFER THINNING TECHNIQUES

BACKGROUND OF THE INVENTION

1. Field of the Invention

The present invention relates generally to semiconductor wafers, and more particularly to techniques for the simultaneous thinning of the backside surfaces of a plurality of semiconductor wafers using a non-crystallographic and uniform etching process.

2. Discussion of the Related Art

Semiconductors are generally defined as materials having an electrical conductivity intermediate between metals and insulators and are used in a wide variety of modern electronic devices. The process of manufacturing semiconductors, or integrated circuits (commonly called ICs, or chips), typically consists of more than a hundred steps, during which hundreds of copies of an integrated circuit are formed on a single wafer.

Generally, the process involves the creation of eight to 20 patterned layers on and into the substrate, ultimately forming the complete integrated circuit. This layering process creates electrically active regions in and on the semiconductor wafer surface. While fabricating integrated circuits, it is commonplace to process both the front side and backside of the wafer.

Wafer thinning, more commonly known as backlapping, is generally carried out at the end of the device fabrication process in order to increase the fabricated wafer's thermal conductivity and to enhance signal transmission integrity across the device. Additionally, the wafer is thinned to facilitate correct operation of microwave or millimeter wave circuits. The wafer is normally thinned from the backside surface. A uniform (i.e., isotropic) etching process is generally needed to effectively thin the wafers to the desired final thickness.

In most cases, this involves reducing the wafer thickness from an initial 400-700 $\mu$m range down to a final range typically from 250 $\mu$m or less. In fact, current manufacturers of increasingly sophisticated and miniaturized electronic devices are demanding even thinner wafers, and therefore, 125 $\mu$m or less is now a fairly common final wafer thickness requirement. However, current mechanical (e.g., polishing), wet (e.g., chemical etch), and dry (e.g., plasma gas) thinning methods, even those capable of supposedly producing an acceptable final wafer thickness, do not provide good etch uniformity within an individual wafer, as well as good etch uniformity in a given batch of wafers (i.e., wafer-to-wafer uniformity). This lack of uniformity results in a high number of defective wafers that must be discarded, thus raising manufacturing costs and causing production delays.

Therefore, there is a need to develop techniques for thinning the backside surfaces of several wafers simultaneously to provide good etch uniformity within an individual wafer, as well as good etch uniformity in a given batch of wafers (i.e., wafer-to-wafer uniformity).

SUMMARY OF THE INVENTION

The present invention provides methods and apparatuses for the simultaneous thinning of the backside surfaces of a plurality of semiconductor wafers using a non-crystallographic and uniform etching process.

In accordance with the general teachings of the present invention, methods and apparatuses for simultaneously thinning the backside surfaces of a plurality of wafers comprised of a semiconductor material are provided.

The methods include the steps of (1) providing a fixture having a plurality of horizontally oriented receptacles for receiving the plurality of semiconductor wafers, (2) loading the plurality of semiconductor wafers into the plurality of receptacles, (3) providing an etchant solution capable of isotropically removing a layer of semiconductor material from the backside surface of the plurality of semiconductor wafers, and (4) immersing the loaded fixture into the etchant solution for a sufficient period of time to cause the removal of a layer of semiconductor material from the backside surface of the plurality of semiconductor wafers to form a plurality of thinned semiconductor wafers.

The apparatuses include (1) a fixture having a plurality of horizontally oriented receptacles for loading the plurality of semiconductor wafers therein, and (2) an etchant solution capable of isotropically removing a layer of semiconductor material from the backside surface of the plurality of semiconductor wafers, wherein when the loaded fixture is immersed into the etchant solution for a sufficient period of time a layer of semiconductor material is removed from the backside surface of the plurality of semiconductor wafers to form a plurality of thinned semiconductor wafers.

Additional objects, advantages, and features of the present invention will become apparent from the following description and appended claims, taken in conjunction with the accompanying drawings.

BRIEF DESCRIPTION OF THE DRAWINGS

The same reference numerals refer to the same parts throughout the various Figures.

DETAILED DESCRIPTION OF THE PREFERRED EMBODIMENTS

The present invention focuses on wafer thinning techniques employed while processing the backside of semiconductor wafers. The following discussion of the preferred embodiments directed to methods and apparatuses for the simultaneous thinning of the backside surfaces of a plurality of semiconductor wafers using a non-crystallographic and uniform etching process are merely exemplary in nature, and are in no way intended to limit the invention or its applications or uses.

Figure 1:
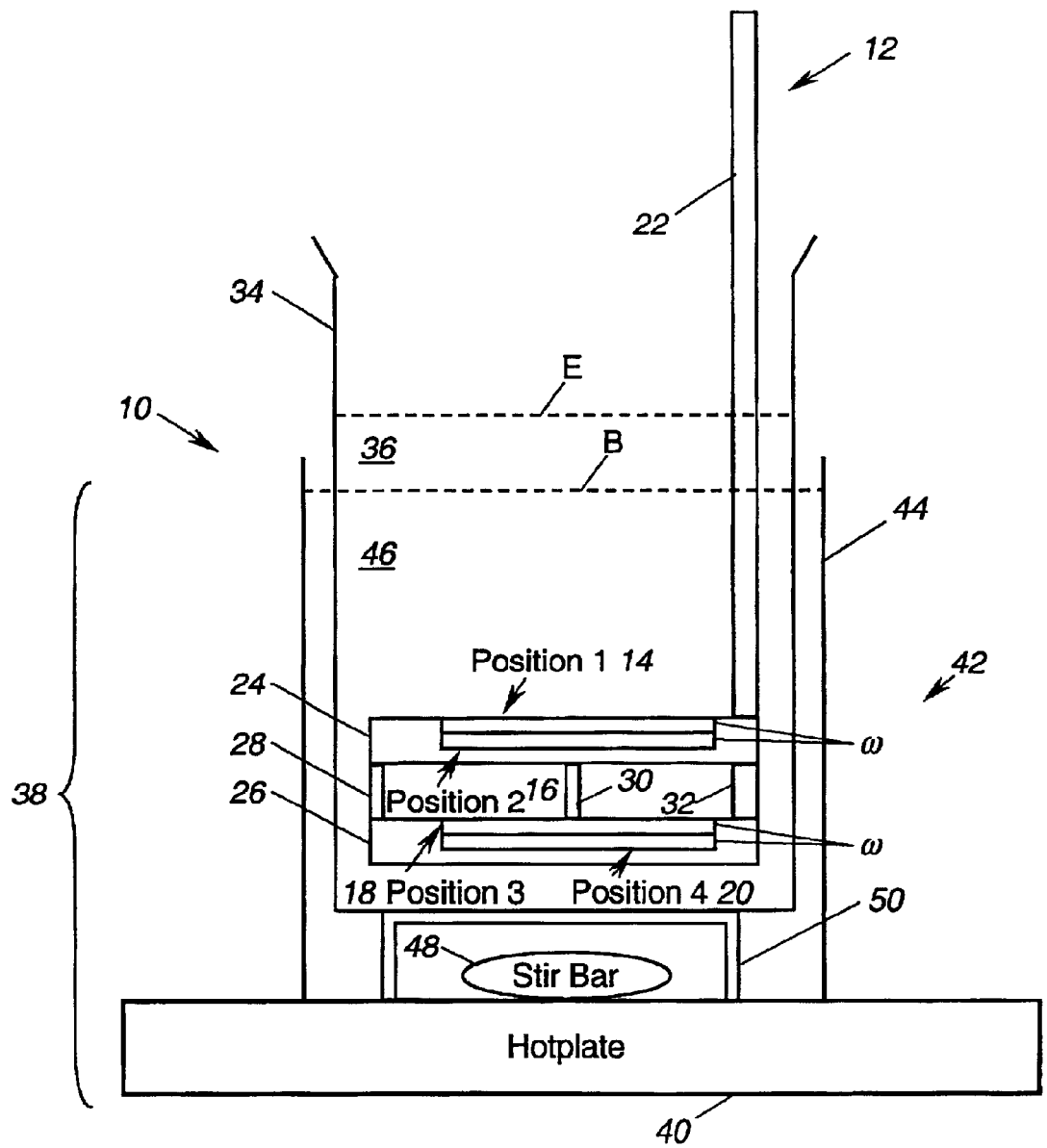
FIG. 1 is a schematic view of an apparatus for simultaneously thinning the backside surfaces of a plurality of wafers comprised of a semiconductor material, in accordance with one embodiment of the present invention.
Figure 1A:
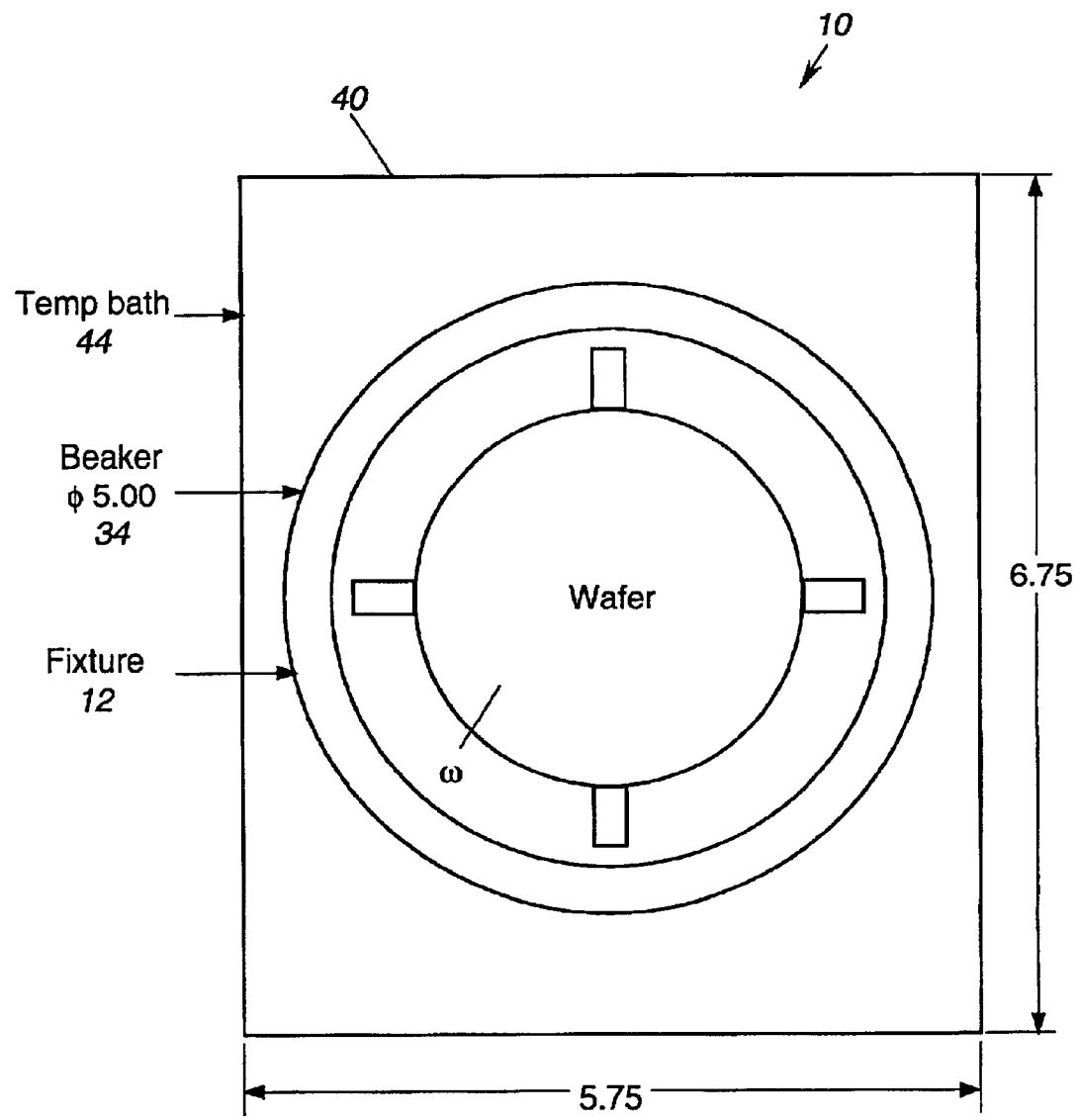
FIG. 1A is a top plan view of the apparatus depicted in FIG. 1, in accordance with one embodiment of the present invention.

With reference to FIGS. 1 and 1A, there is shown an exemplary apparatus 10 for the simultaneous thinning of the backside surfaces of a plurality of semiconductor wafers using a non-crystallographic and uniform etching process, in accordance with one embodiment of the present invention.

Apparatus 10 includes a fixture 12 having a plurality of receptacles 14, 16, 18, 20 (also denoted as positions 1, 2, 3, and 4, respectively) for receiving a plurality of semiconductor wafers, all denoted as W, that need to have the backside surfaces thereof thinned. In accordance with a preferred embodiment of the present invention, the semiconductor wafers are comprised of an indium phosphide material, although it is envisioned that other semiconductor materials may be used to practice the present invention. Additionally, although four receptacles are shown in FIG. 1, it should be appreciated that either less than, or more than four receptacles may be provided. In accordance with a preferred embodiment, it is envisioned that six receptacles will be provided on the fixture 12.

Fixture 12 preferably includes a handle member 22 connected to at least one platform member which contains the receptacles. In this view, two platform members 24, 26, are shown, although it is envisioned that either less than, or more than two platforms may be employed. Platforms 24, 26 are preferably connected together, via members 28, 30, 32, to provide greater structural integrity to fixture 12.

It should be noted that the semiconductor wafers W are preferably masked, or otherwise protected, on the frontside surface (as well as the side surfaces, if desired) to protect the delicate circuitry previously established thereon. In this manner, only the backside surface of the semiconductor wafer W will be acted upon by the etchant solution.

Once the semiconductor wafers W are loaded (e.g., mounted and bonded) into their respective receptacles, loaded fixture 12 is then ready to be immersed into an appropriate etchant solution which will accomplish the actual thinning of the wafers.

However, it is first necessary to provide a receptacle 34 in which to contain etchant solution 36. Receptacle 34 is filled to a desired level E with etchant solution 36. In accordance with a preferred embodiment of the present invention, etchant solution 36 is preferably capable of isotropically removing a layer of semiconductor material from the backside surface of a semiconductor wafer. In accordance with a still more preferred embodiment of the present invention, etchant solution 36 is preferably capable of isotropically removing a layer of semiconductor material comprised of indium phosphide from the backside surface of a semiconductor wafer. In accordance with a highly preferred embodiment of the present invention, etchant solution 36 is preferably a mixture of acetic acid, hydrogen bromide, potassium dichromate, and water. In accordance with the most preferred embodiment of the present invention, etchant solution 36 is preferably a mixture of mixture of acetic acid, hydrogen bromide, potassium dichromate, and water in the ratio of about 4.5 parts acetic acid:1.5 parts hydrogen bromide:132 parts potassium dichromate:1 part water.

Additionally, it is generally necessary to provide an apparatus for raising and/or maintaining the temperature of etchant solution 36 to a preferred range. It is believed that etchant solution 36 of the present invention performs best when maintained at a temperature in the range of about 40° C. to about 50° C. In accordance with a preferred embodiment of the present invention, the temperature of etchant solution 36 is maintained at a temperature of about 48° C.

In order to provide this temperature range, it is necessary to employ a temperature control 38, which can include a source of heat, such as a hot plate 40 adjacent to a temperature bath 42. Temperature bath 42 preferably includes a receptacle 44 filled with a liquid 46, such as water, filled to a desired level B. By way of a non-limiting example, hotplate 40 may be programmed (via a computer) to maintain temperature bath 42 within a pre-determined, specific temperature range. Preferably, receptacle 34 filled with etchant solution 36 is disposed within receptacle 44 filled with liquid 46, so as to provide the appropriate level of warming, if necessary.

It has also been noted that circulation of etchant solution 36 is generally necessary to achieve the desired level and precision of thinning. Accordingly, a circulation apparatus, such as a stir bar 48 is provided, preferably at the bottom of receptacle 44. Preferably, stir bar 48 is the magnetic type. In order to avoid actual physical contact between stir bar 48 and receptacle 34, a platform 50 is provided to separate the two structures.

Loaded fixture 12 may now be lowered into the heated and circulating etchant solution 46 so that the thinning operation may now take place. Loaded fixture 12 is kept in etchant solution 36 for a sufficient period of time to accomplish the desired level of thinning. A time period in the range of about 1 minute to about one hour is usually sufficient to accomplish any desired level of thinning. Once that time period has elapsed, loaded fixture 12 is then removed from etchant solution 36, and then from fixture 12, wherein the thinned wafers W may now be further processed, if necessary, or used in any number of different semiconductor applications, for example, with bipolar and field effect transistor microwave or millimeter wave circuits.

When the thinned semiconductor wafers W were examined, it was observed that a significant amount of isotropic thinning had occurred. For example, the thinned semiconductor wafers W had a final thickness in the range of about 25 to about 250 $\mu$m. Additionally, it was observed that the level of thinning across each individual wafer was remarkably uniform, and furthermore, the level of thinning among wafers from the batch were also remarkably uniform with respect to one another. The level of thinning across each individual wafer was approximately 5-6 $\mu$m (total thickness variation) for 15-20 $\mu$m removed by polishing and approximately 10 $\mu$m (total thickness variation) for 40-45 $\mu$m removed by polishing when measured in five locations on the wafer (i.e., center and 12.5 $\mu$m from the edge of a 76 $\mu$m wafer at the top, bottom, right, and left).

Figure 2:
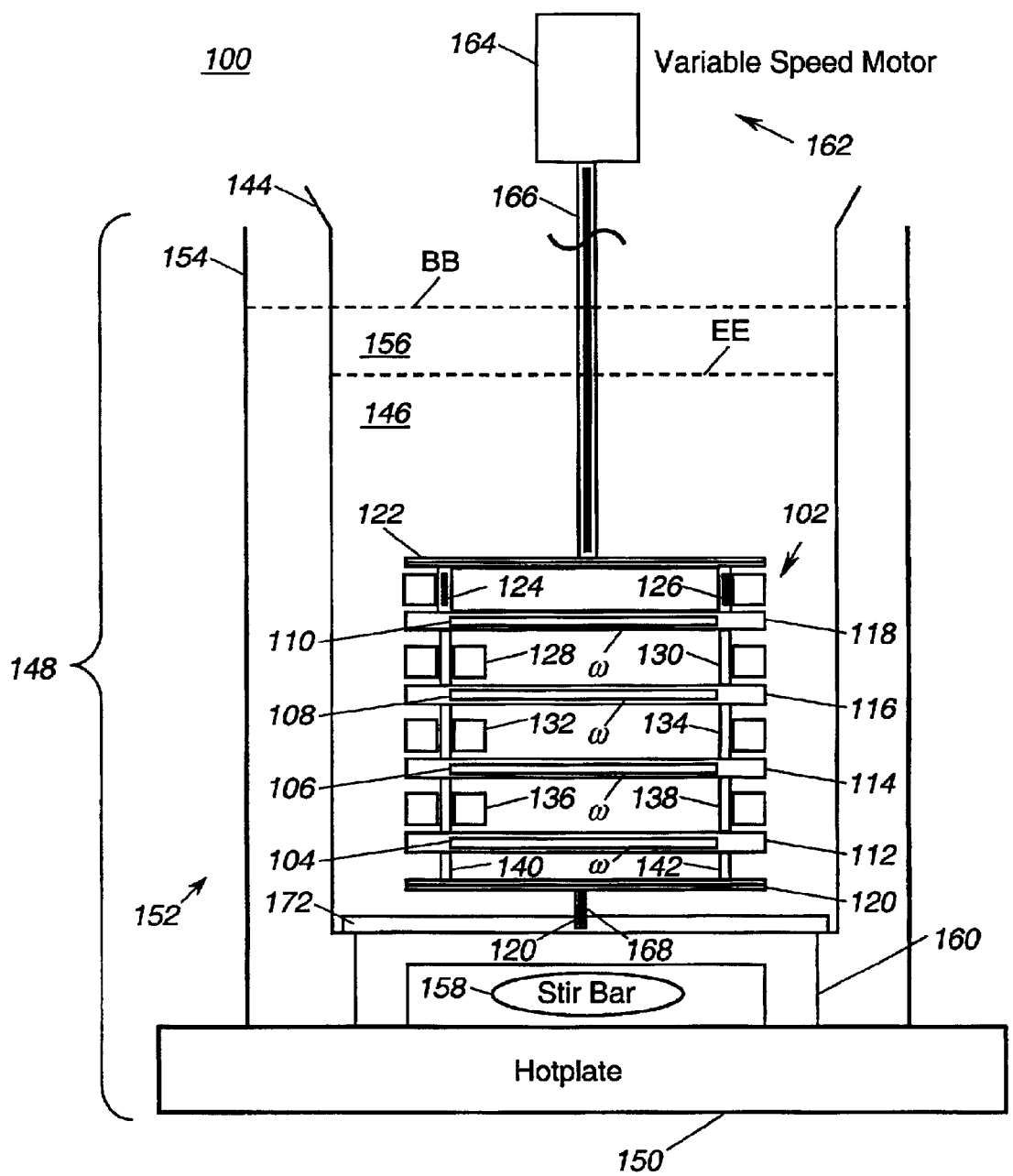
FIG. 2 is a schematic view of another apparatus for simultaneously thinning the backside surfaces of a plurality of wafers comprised of a semiconductor material, in accordance with an alternative embodiment of the present invention.
Figure 2A:
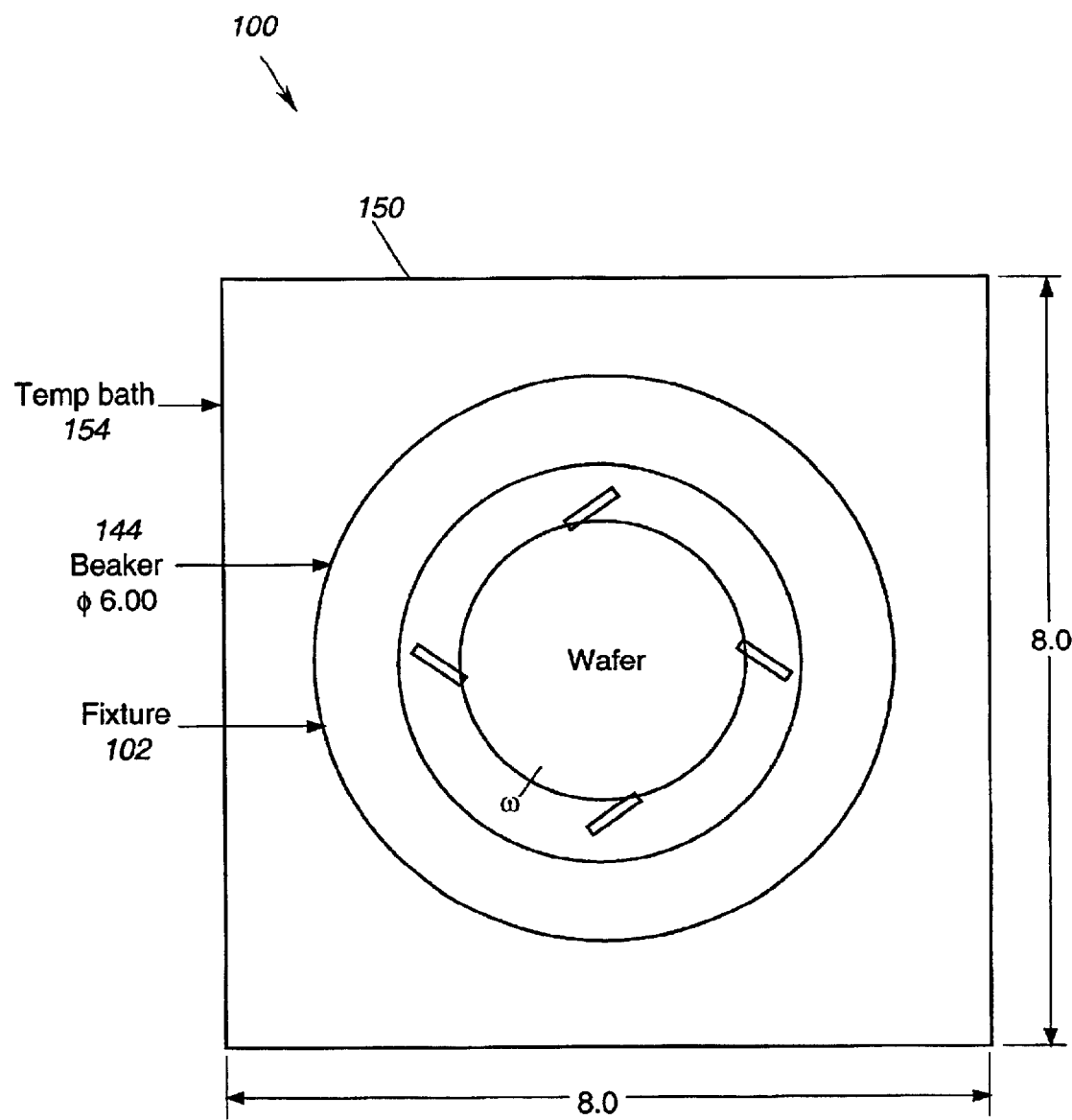
FIG. 2A is a top plan view of the apparatus depicted in FIG. 2, in accordance with an alternative embodiment of the present invention.

With reference to FIGS. 2 and 2A, there is shown another exemplary apparatus 100 for the simultaneous thinning of the backside surfaces of a plurality of semiconductor wafers using a non-crystallographic and uniform etching process, in accordance with an alternative embodiment of the present invention.

In this alternative embodiment, the fixture 102 is rather different from fixture 12 depicted in FIGS. 1 and 1A. Fixture 102 includes a plurality of receptacles 104, 106, 108, 110 for receiving a plurality of semiconductor wafers, all denoted as W, that need to have the backside surfaces thereof thinned. In accordance with a preferred embodiment of the present invention, the semiconductor wafers are comprised of an indium phosphide material, although it is envisioned that other semiconductor materials may be used to practice the present invention. Additionally, although four receptacles are shown in FIG. 2, it should be appreciated that either less than, or more than four receptacles may be provided. In accordance with a preferred embodiment, it is envisioned that six receptacles will be provided on fixture 102.

Fixture 102 preferably includes at least one platform member which contains the receptacles. In this view, four platform members 112, 114, 116, 118 are shown, although it is envisioned that either less than, or more than four platforms may be employed. Additionally, a top platform 120 and a bottom platform 122 are also provided. Additionally, a plurality of support members 124, 126, 128, 130, 132, 134, 136, 138, 140, 142 are provided to connect the various platforms together and provide structural integrity to fixture 102.

It should be noted that the semiconductor wafers W are preferably masked, or otherwise protected, on the frontside surface (as well as the side surfaces) to protect the delicate circuitry previously established thereon. In this manner, only the backside surface of the semiconductor wafer W will be acted upon by the etchant solution.

Once the semiconductor wafers are loaded into their respective receptacles, loaded fixture 102 is then ready to be immersed into an appropriate etchant solution which will accomplish the actual thinning of the wafers.

Again, however, as with the first embodiment, it is first necessary to provide a receptacle 144 in which to contain the etchant solution 146. Receptacle 144 is filled to a desired level EE with etchant solution 146. In accordance with a preferred embodiment of the present invention, etchant solution 146 is preferably capable of isotropically removing a layer of semiconductor material from the backside surface of a semiconductor wafer. In accordance with a still more preferred embodiment of the present invention, etchant solution 146 is preferably capable of isotropically removing a layer of semiconductor material comprised of indium phosphide from the backside surface of a semiconductor wafer. In accordance with a highly preferred embodiment of the present invention, etchant solution 146 is preferably a mixture of mixture of acetic acid, hydrogen bromide, potassium dichromate, and water. In accordance with the most preferred embodiment of the present invention, etchant solution 146 is preferably a mixture of acetic acid, hydrobromic acid, potassium dichromate, and water. The preferred volume ratio is about 4.5 parts water:3 parts hydrobromic acid (48 vol. %):1 part acetic acid (glacial) and 77.6 g potassium dichromate per 1000 ml of solution.

Also, as with the first embodiment, it is generally necessary to provide an apparatus for raising and/or maintaining the temperature of etchant solution 146 to a preferred range. It is believed that etchant solution 146 of the present invention performs best when maintained at a temperature in the range of about 40° C. to about 50° C. In accordance with a preferred embodiment of the present invention, the temperature of etchant solution 146 is maintained at a temperature of about 48° C.

In order to provide this temperature range, it is necessary to employ a temperature control 148, which can include a source of heat, such as a hot plate 150 adjacent to a temperature bath 152. Temperature bath 152 preferably includes a receptacle 154 filled with a liquid 156, such as water, filled to a desired level BB. By way of a non-limiting example, hotplate 150 may be programmed (via a computer) to maintain temperature bath 152 within a pre-determined, specific temperature range. Preferably, receptacle 144 filled with etchant solution 146 is disposed within receptacle 154 filled with liquid 156, so as to provide the appropriate level of warming, if necessary.

Again, it has also been noted that circulation of etchant solution 146 is generally necessary to achieve the desired level and precision of thinning. Accordingly, a circulation apparatus, such as a stir bar 158 is provided, preferably at the bottom of receptacle 154. Preferably, stir bar 158 is the magnetic type. In order to avoid actual physical contact between stir bar 158 and receptacle 144, a platform 160 is provided to separate the two structures.

However, in order to enhance the level and effectiveness of the circulation of etchant solution 146, an optional selective rotation apparatus 162 is provided. Rotation apparatus 162 preferably includes a variable speed motor 164 connected to a spindle 166 which is in turn connected to top platform 122. Bottom platform 120 is provided with a short spindle 168 which is disposed within a recess 170 formed in a platform 172 disposed on the bottom of receptacle 144. Thus, when variable speed motor 164 is actuated, the entire fixture 102 can be revolved about a vertical axis formed between spindle 166 and spindle 168.

Loaded fixture 102 may now be lowered into the heated and circulating etchant 146 so that the thinning operation may now take place. Loaded fixture 102 is kept in etchant solution 146 for a sufficient period of time to accomplish the desired level of thinning. A time period in the range of about 1 minute to about one hour is usually sufficient to accomplish any desired level of thinning. Once that time period has elapsed, loaded fixture 102 is then removed from etchant solution 146, and then removed from fixture 102, wherein the thinned wafers W may now be further processed, if necessary, or used in any number of different semiconductor applications, for example, with bipolar and field effect transistor microwave or millimeter wave products.

When the thinned semiconductor wafers W were examined it was observed that a significant amount of isotropic thinning had occurred. For example, the thinned semiconductor wafers W had a final thickness in the range of about 25 to about 250 $\mu$m. Additionally, it was observed that the level of thinning across each individual wafer was remarkably uniform, and furthermore, the level of thinning among wafers from the batch were also remarkably uniform with respect to one another. The level of thinning across each individual wafer was approximately 5-6 $\mu$m (total thickness variation) for 15-20 $\mu$m removed by polishing and approximately 10 $\mu$m (total thickness variation) for 40-45 $\mu$m removed by polishing when measured in five locations on the wafer (i.e., center and 12.5 mm from the edge of a 76 mm wafer at the top, bottom, right, and left).

Figure 3:
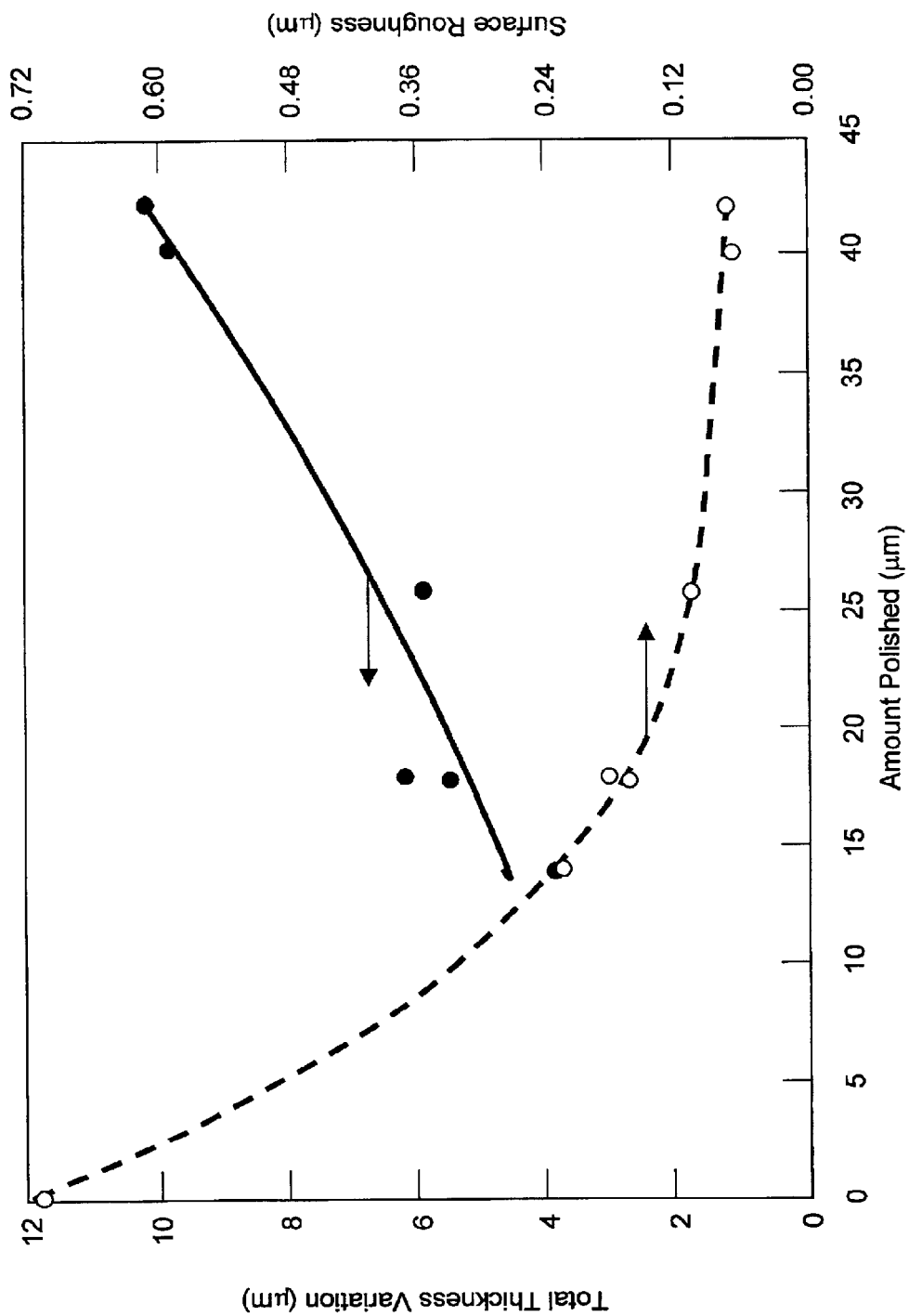
FIG. 3 is a graphical illustration of the total thickness variation (TTV) and surface roughness for various amounts polished for lapped InP wafers, in accordance with the general teachings of the present invention.

With reference to FIG. 3, there is shown a graphical illustration of the total thickness variation and surface roughness for various amounts polished for lapped InP wafers.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. An apparatus for simultaneously thinning the backside surfaces of a plurality of wafers comprised of a semiconductor material, comprising:

a fixture having a plurality of horizontally orientated receptacles for loading the plurality of semiconductor wafers therein, wherein each of the receptacles provides a horizontal surface adapted to support at least one semiconductor wafer; and an etchant solution capable of isotropically removing a layer of semiconductor material from the backside surface of the plurality of semiconductor wafers, wherein the etchant solution is comprised of a mixture having a volume ratio of about 4.5 parts water:3 Darts hydrobromic acid:1 part acetic acid and 77.6 g potassium dichromate per 1000 ml of solution;

wherein when the loaded fixture is immersed into the etchant solution for a sufficient period of time a layer of semiconductor material is removed from the backside surface of the plurality of semiconductor wafers to form a plurality of thinned semiconductor wafers.

2. The apparatus according to claim 1, further comprising a rotation apparatus for rotating the fixture.

3. The apparatus according to claim 1, further comprising a circulation apparatus for circulating the etchant solution.

4. The apparatus according to claim 1, further comprising a temperature adjustment apparatus for adjusting the temperature of the etchant solution.

5. The apparatus according to claim 1, wherein the etchant solution is maintained at a temperature in the range of about 40° C. to 50° C.

6. The apparatus according to claim 1, the semiconductor material includes indium phosphide.

7. The apparatus according to claim 1, wherein the thinned semiconductor wafers are incorporated into devices selected from the group consisting of microwave circuits, millimeter wave circuits, and combinations thereof.

8. The apparatus according to claim 1, wherein the thinned semiconductor wafers have a final thickness in the range of about 25 to 250 $\mu$m.

9. A method for simultaneously thinning the backside surfaces of a plurality of wafers comprised of a semiconductor material, comprising:
   providing a fixture having a plurality of horizontally orientated receptacles for receiving the plurality of semiconductor wafers;
   loading the plurality of semiconductor wafers into the plurality of receptacles;
   providing an etchant solution capable of isotropically removing a layer of semiconductor material from the backside surface of the plurality of semiconductor wafers, wherein the etchant solution is comprised of a mixture of acetic acid, hydrogen bromide, potassium dichromate, and water, and the ratio of acetic acid to hydrogen bromide to potassium dichromate to water is about 4.5:1.5:132:1; and
   immersing the loaded fixture into the etchant solution for a sufficient period of time to cause the removal of a layer of semiconductor material from the backside surface of the plurality of semiconductor wafers to form a plurality of thinned semiconductor wafers.

10. The method according to claim 9, further comprising a rotation apparatus for rotating the fixture.

11. The method according to claim 9, further comprising a circulation apparatus for circulating the etchant solution.

12. The method according to claim 9, further comprising a temperature adjustment apparatus for adjusting the temperature of the etchant solution.

13. The method according to claim 9, wherein the etchant solution is maintained at a temperature in the range of about 40° C. to about 50° C.

14. The method according to claim 9, wherein the semiconductor material includes indium phosphide.

15. The method according to claim 9, wherein the thinned semiconductor wafers are incorporated into devices selected from the group consisting of microwave circuits, millimeter wave circuits, and combinations thereof.

16. The method according to claim 9, wherein the thinned semiconductor wafers have a final thickness in the range of about 25 to about 250 $\mu$m.

* * * * *